CONTROLLABLE SIMULATED INDUCTOR USING TETRODE TRANSISTORS

Filed Jan. 3, 1967

Inventor
Fleming Dias
By Francis W. Crotty
Attorney

United States Patent Office 3,397,363

Patented Aug. 13, 1968

3,397,363

CONTROLLABLE SIMULATED INDUCTOR USING TETRODE TRANSISTORS

Fleming Dias, Chicago, Ill., assignor to Zenith Radio Corporation, Chicago, Ill., a corporation of Delaware Filed Jan. 3, 1967, Ser. No. 607,003
6 Claims. (Cl. 331—8)

ABSTRACT OF THE DISCLOSURE

A simulated inductor circuit employing one or more transistors wherein the apparent inductance is substantially independent of the intrinsic internal impedance of the transistors. In a preferred embodiment the transistors are of the tetrode type having a second base electrode which alters their intrinsic internal impedance according to an applied control effect. Control effect developing means apply a control effect to the second base electrode to vary the apparent inductance as a function of some related variable and include temperature-dependent elements for obviating the effect of temperature variations. The simulated inductor is used as a voltage controlled inductance as part of an oscillator resonant circuit in a phase control loop.

The present invention is directed to circuitry for simulating the reactive effects of an ordinary inductor and, more particularly, to an improved simulated inductor circuit suitable for application in integrated circuits.

The advent of integrated circuit technology has provided a long sought after means for manufacturing electronic circuits in microminiature sizes which are many hundreds or thousands of times smaller than their corresponding discrete component counterparts. Such extreme reductions in size have imposed rigorous limitations on component values and component types, especially where these factors are related significantly to the physical dimensions of the component. Perhaps the most severe limitation has been incurred with regard to ordinary inductors which are rendered totally impractical for such application because of the relatively enormous volume dimension needed for any practical inductive reactance value. Also, the constructural configuration of an inductor is not well-suited for manufacture by presently known integrated circuit processes.

Since an inductor provides an important circuit effect useful in a wide variety of applications, it is highly desirable to simulate the functional characteristics of this type of device by some arrangement suitable for integrated circuit construction. There are several approaches to this problem known to the art each having its peculiar advantages and disadvantages depending on the specific problem at hand. One simulated inductor circuit comprises a transistor having input terminals between its emitter and base electrodes. At relatively high frequencies, that is, frequencies in the order of several megacycles and above, the finite time interval required for the emitter current to traverse the base region of the transistor results in a collector current which is perceptibly delayed in phase and a base current which tends toward a 90° phase relation with respect to the emitter current. A cascading of additional stages, such that the emitter current of a following stage is provided by the base current of the preceding stage, permits shifting of the base current of the final stage, and thus the voltage developed across an external base resistor, into an approximate 90° orientation with the emitter current of the initial stage to thereby simulate an ideal inductor. The precise physics of the inductive effect will be considered in more detail later herein. It is sufficient to understand for now that in such an arrangement the value of simulated inductance and the Q of the circuit is a function of the intrinsic internal impedance of the transistors involved. From a practical standpoint, this represents a serious limitation on the utility of this form of simulated inductor as its apparent inductance varies widely with a change in transistors and to a generally intolerable extent with the same transistor if the environment of use experiences material variations in ambient temperature.

It is therefore an object of the present invention to provide a simulated inductor of the foregoing type which is substantially insensitive to variations in ambient temperature over a wide range and which is compatible with the various requirements of integrated circuit construction.

It is another object of the present invention to provide an adaptive simulated inductor circuit which is capable of changing its apparent inductive value in accordance with a predetermined control condition.

It is a further object of the present invention to provide a simulated inductor circuit whose apparent inductive value and Q can be altered substantially independently as functions of predetermined independent control conditions.

It is a more specific object of the present invention to provide an improved automatic frequency control circuit suitable for integrated circuit applications.

Accordingly, the present invention is directed to a simulated inductor circuit comprising a solid-state amplifying device having a pair of primary electrodes and a control electrode and further having an inherent internal impedance. Means including the amplifying device are provided for simulating an inductive reactance having a value of reactance which is a function of the internal impedance. Control means are included in the amplifying device for controlling the internal impedance in response to an applied control effect. Further means are provided for developing a control effect and for applying it to the control means.

The features of the present invention which are believed to be novel are set forth with particularity in the appended claims. The invention, together with further objects and advantages thereof, may best be understood by reference to the following description taken in connection with the accompanying drawing, in the several figures of which like reference numerals identify like elements, and in which:

Figure 1:
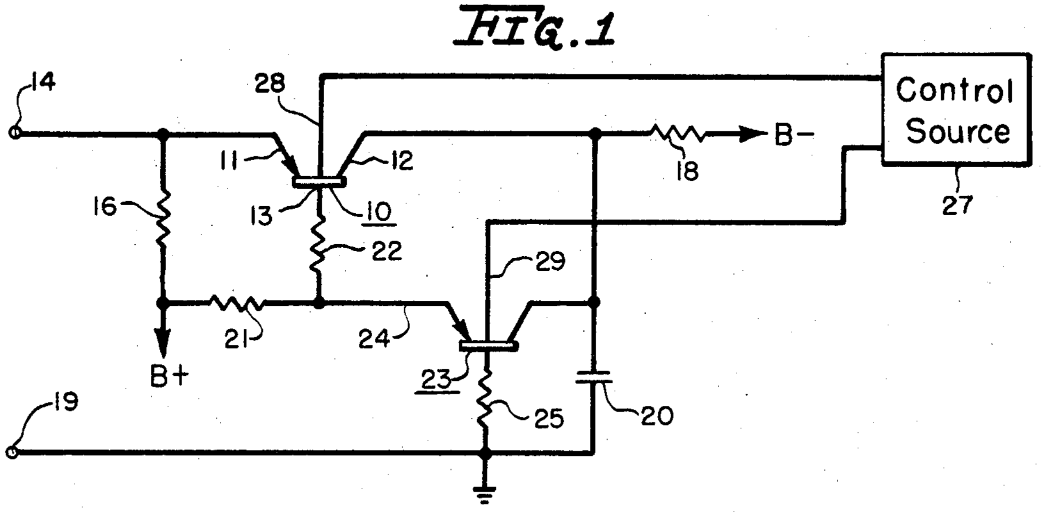
FIGURE 1 is a schematic circuit diagram of a preferred embodiment of the present invention.

Referring to FIGURE 1, the improved simulated inductor circuit there shown comprises an amplifying device 10 having a pair of primary electrodes 11 and 12 and a control electrode 13 and further having an inherent internal impedance. Device 10 is a transistor of PNP gender and electrodes 11–13 are respectively an emitter, collector and base electrode. Means including device 10 are provided for simulating an inductor having a value of apparent reactance which is a function of the intrinsic impedance of the transistor. Specifically, emitter 11 is directly coupled to an input terminal 14 and also to a B+ supply through a biasing resistor 16. Collector 12 is coupled to a B− supply through a current limiting resistor 18 and to another input terminal 19 by a capacitor 20 which is a low impedance to alternating currents.

Amplifying device 10 is cascaded with a second such device in the form of a transistor 23 of the PNP type having an emitter electrode 24 coupled to the common junction of a pair of resistors 21 and 22 to thereby receive as a combined input the base current of transistor 10 and a biasing current from the B+ supply, through resistors 22, 21, respectively. The collector and base electrodes of transistor 23 are returned to ground at input terminal 19 by capacitor 20 and a resistor 25, respectively.

In accordance with the present invention, a control means is included in one or both of the transistors for controlling the internal impedance in response to an applied control effect. A control source 27 is coupled to this control means and applies a control effect to vary the intrinsic internal impedance of one or both of the transistors in accordance with a predetermined control condition or conditions. In the illustrated and preferred embodiment of the invention, transistors 10 and 23 include additional base electrodes 28 and 29 respectively which are connected to the control effect developing means 27. Means 27 is not illustrated in detail as the construction thereof may take any of a wide variety of forms known to the art depending on the nature of the control condition to be responded to in controlling the internal impedance of transistors 10 and 23 and, consequently, the properties of the simulated inductor. For example, it may only be desired to compensate for variations in the internal impedance of the individual transistors due to changes in the ambient tempertaure. Alternatively, it may be desired to have the circuit perform an adaptive function, that is, alter its apparent inductance and/or Q in accordance with some control current or voltage. One example of the construction of means 27 will be described later herein with reference to the automatic frequency control circuit of FIGURE 4.

In considering the operation of the circuit of the invention, the effects of means 27 and the additional electrodes 28 and 29 of transistors 10 and 23 will be momentarily neglected. Under these circumstances, the simulated inductor circuit is without any control mechanism and is substantially identical to that disclosed in an article entitled "A High Q Inductive Transistor Circuit and a Tuned Oscillator for Microminiature Applications," International Journal of Electronics, July 1965, by S. C. Dutta Roy. A complete analysis of the operation of such a simulated inductor is provided by the Dutta Roy article. Briefly, the operation of this circuit may be understood in its essential respects by consideration of the vector diagram of FIGURE 2; consistent with conventional vector notation, a horizontal vector denotes a real component of current while a vertical vector denotes a reactive component of current. In this figure, the subscripts *e*, *b* and *c*, stand respectively for the emitter, base and collector electrodes of a transistor while the subscripts 1 and 2 are shorthand indications for transistors 10 and 23, respectively. The symbol $\alpha$ is used in its conventional sense to denote the current amplification factor of a transistor and it is assumed that the $\alpha$'s of transistors 10 and 23 are identical.

Figure 2:
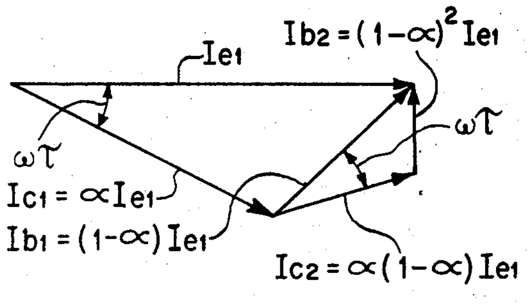
FIGURE 2 is a vector diagram of various electrical currents and is useful in understanding the operation of the circuit of FIGURE 1.

Now, consistent with the foregoing terminology, if it is assumed that a current $Ie1$, indicated by the horizontal vector of FIGURE 2, flows into emitter electrode 11, then it will be recognized by those skilled in the art that the collector current $Ic1$ is equal to $\alpha$ times the emitter current and that the collector current is delayed in angular phase by $\omega\tau$ radians where $\omega$ is the angular frequency of the input signal and $\tau$ is the interval of time required for the current to traverse the base region of the transistor. By Kirchhoff's law, the collector current and base current must necessarily sum to equal the emitter current. Hence, the base current $Ib1$ is of a magnitude and phase indicated by the vector joining the collector and emitter current vectors. This current flowing through base resistor 22 develops a voltage which consists of two components one in phase with the emitter current and one 90° out of phase therewith. That portion of the current in phase with the emitter current develops a voltage which is indicative of the resistive component of the inductor which this circuit simulates while that portion of the current 90° out of phase therewith develops a voltage which is indicative of the apparent reactance of the simulated inductor.

As is clear from the vector diagram of FIGURE 2, a relatively large component of the base current of transistor 10 is in phase with the emitter current and thus the Q of the simulated inductor is rather low. This situation is greatly improved by the presence of second transistor 23. As previously explained, the emitter current of transistor 23 is the base current of transistor 10. By the same analysis of relevant current vectors, the collector current of this transistor will be delayed in angular phase by an amount equal to $\omega\tau$ radians and it will be seen from the vector diagram that the base current $Ib2$ of transistor 23 is oriented at approximately 90° to the emitter current of transistor 10. Thus there is developed across base resistor 25 of transistor 23 a voltage which, taken in conjunction with the input current $Ie1$, precisely simulates the effect of an inductor, that is, the input current lags voltage by 90°. Since the horizontal or real component of the current $Ib2$ can be made extremely small, the Q of this simulated inductor is quite high.

Figure 3:
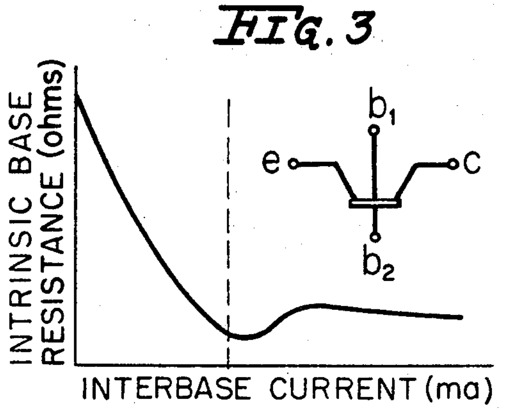
FIGURE 3 is a graph depicting the variation in intrinsic base resistance of a tetrode transistor for various values of control currents flowing into the second base electrode of this transistor.

It can be shown by a consideration of the equivalent circuit of transistor 10 that the apparent reactance thereof is a function of the intrinsic base resistance of this transistor. Since the intrinsic impedance parameters of transistors vary widely from one device to another and also in a single device fluctuate materially with variations in ambient temperature, the practical utility of this circuit arrangement is severely restricted. However, in accordance with the illustrated and preferred embodiment of the present invention, these shortcomings are obviated by the use of a special type of tetrode transistor in conjunction with an appropriate control source. Specifically, both transistors 10 and 23 of the circuit of FIGURE 1 are of the dual-base tetrode type. One type of such transistor suitable for use in the circuit of the invention is disclosed in an article by R. L. Wallace et al. entitled, "Junction Transistor Tetrode for High Frequency Use," published in the Proceedings of the IRE of November 1952. As there disclosed, the intrinsic base resistance of an ordinary transistor can be altered by providing an additional base electrode and biasing this electrode in a specified manner. A graph similar to that illustrated in the Wallace article is reproduced in FIGURE 3. From this graph, it will be observed that the intrinsic base resistance varies approximately linearly with interbase current up to a current value indicated by the dashed vertical line on the graph.

It is precisely the above functional characteristic of a tetrode transistor which is used to advantage in the circuit of the present invention. Specifically, control source 27 provides a control current to electrodes 28 and 29 of transistors 10 and 23 such that any variations in the intrinsic base resistance of either of these devices with changes in ambient temperature is fully counteracted and the simulated inductance of the circuit held constant. Additionally, control source 27 may supply control currents to intentionally vary the apparent reactance of the circuit according to some control function. It can be demonstrated that to a first order of approximation changes in the intrinsic base resistance of transistor 10 alter only the apparent reactance value of the circuit while changes in the intrinsic base resistance of transistor 23 alter only the Q of the circuit. Thus, the simulative circuit provides two degrees of freedom not possible with an ordinary inductor. It should also be recognized that the invention is not limited in its broader aspects to the particular type of transistor disclosed and that a wide scope of devices whose intrinsic impedance can be varied by either voltage or current are suitable for use in the circuit of the invention. Also, heretofore the frequency range over which any given transistor construction could be made to exhibit an inductive characteristic was rather limited because of the dependency of this range on the fundamental design parameters of the device, such as the width of the base region, etc. However, the present invention permits a given transistor construction to have utility over a materially broader frequency span.

Figure 4:
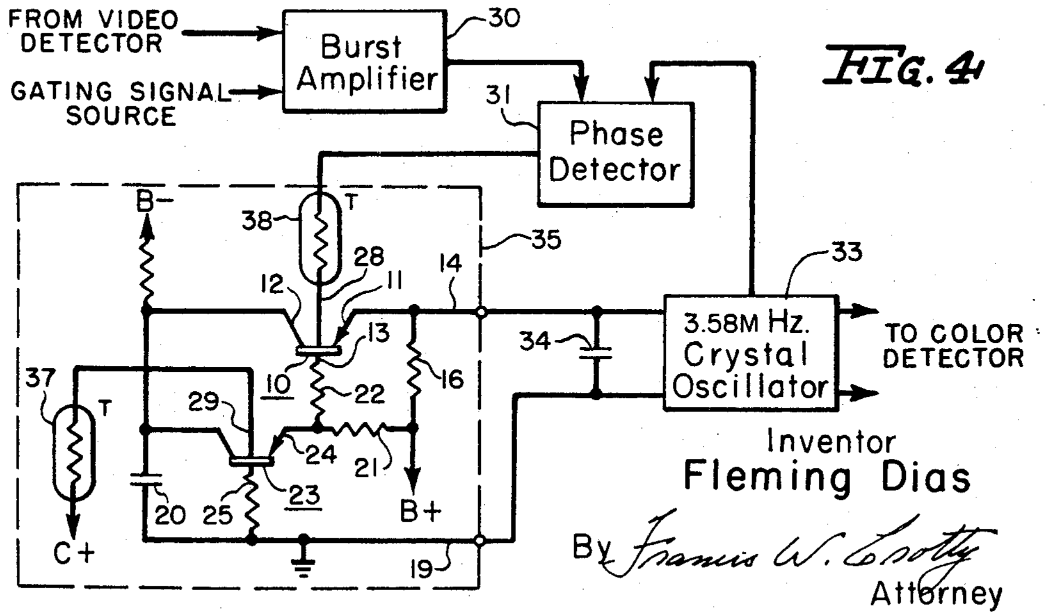
FIGURE 4 is a partial schematic diagram of a color television receiver embodying the simulated inductor circuit of the present invention as an automatic frequency control element.

The numerous applications of such a circuit arrangement will be recognized by those skilled in the art, however, an illustrative application of the present circuit as an adaptive element for an automatic frequency control system of a color television receiver is illustrated in FIGURE 4. For clarity, most of the color television receiver circuits are omitted and only those circuits pertinent to an understanding of the invention are illustrated. A general understanding of the operation of a color television receiver may be had by reference to Reissue Patent No. 24,747 to Adler et al., assigned to the same assignee as the present invention. As background, however, it should be recognized that the carrier modulation of a NTSC standard color television transmission includes a suppressed-carrier component which is amplitude modulated with information defining the hue and saturation of an image to be reproduced. To properly demodulate this component, a local oscillator provides an oscillation signal which is in frequency and phase coherence with a component of the absent subcarrier. To insure that such synchronism or coherence exists, the color transmission includes a periodically transmitted component, known as a "burst" signal, which bears the desired relation to the absent subcarrier. It is conventional procedure to compare the local oscillation signal and the transmitted reference signal in a conventional phase detector to derive an error signal which adjusts the nominally tuned frequency of the local oscillator to the burst standard.

Referring now specifically to FIGURE 4, a burst amplifier 30 is provided with a pair of inputs from respectively a video detector and a gating signal source which is usually the horizontal deflection system. The signal from the output of amplifier 30 is applied to a phase detector 31 wherein it is compared with a local oscillation signal developed in crystal oscillator 33 which is nominally tuned to the 3.58 mHz. frequency of the absent subcarrier. The exact operating frequency of oscillator 33 is established by the parallel resonant frequency of a capacitor 34 and the simulated inductor circuit of the invention, shown in dashed outline 35 in the drawing. Except for additional circuitry added thereto, the circuit is identical to that disclosed in FIGURE 1 and for this reason the same reference numerals are used.

In the present circuit arrangement, it is desired that the Q of the inductor be rather high and remain constant independent of variations in ambient temperature. To this end, a thermistor 37 is coupled from electrode 29 to a constant voltage C+ bias supply. The interbase current for transistor 23 is dependent on the resistance of thermistor 37 which is, of course, a function of ambient temperature; variations in current through the thermistor and the proportional resistance heating effects have only a negligible effect on the impedance of this element. The base electrode 28 of transistor 10 is coupled to phase detector 31 through a thermistor 38.

In operation, the burst signal component of the output signal of the video detector is coupled to burst amplifier 30 which is periodically gated to an on condition from a gating signal source so as to be operative only during intervals in which reference burst signals are present. The amplified burst signals are coupled to a phase detector 31 along with the output signal of local oscillator 33 whereat there is derived an error signal which is of a magnitude and polarity corresponding to any phase discrepancy between the burst and local signal. The error current is supplied to base electrode 28 of transistor 10 to alter the intrinsic base impedance of this device and thus the value of the simulated inductance in proportion to this current. The series thermistor 38 compensates for temperature changes in the same manner as does thermistor 37. Thus, the current injected into electrode 28 is such as to maintain the inductance of the circuit constant irrespective of temperature and to only change the apparent inductance in proportion to any phase discrepancy between the local reference signal and the burst signal. In this regard, it is of course presumed in all of the foregoing that transistors 10 and 23 are provided with a quiescent interbase current somewhere between zero and the value indicated by the dashed vertical line of FIGURE 3 so that intrinsic base impedance may be conveniently increased or decreased by the control source.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A simulated inductor circuit for simulating between first and second input terminals a value of inductive reactance dependent on an applied control effect:
- a first solid-state amplifying device having an inherent internal impedance, a pair of primary electrodes, a control electrode, and an additional electrode, said additional electrode controlling the internal impedance of said first device in response to an applied control effect;
- means for coupling one of said primary electrodes of said first device to said first input terminal;
- a second solid-state amplifying device cascade-connected with said first device and having a pair of primary electrodes, a control electrode, and an inherent internal impedance;
- means for coupling one of said primary electrodes and said control electrode of said second device in series between said control electrode of said first device and said second input terminal;
- means including said first and second amplifying devices for simulating across said input terminals an inductive reactance having a value which is a function of said internal impedances;
- and means for applying said control effect to said additional electrode to vary the internal impedance of said first amplifying device, and hence the value of said simulated inductance.

2. A simulated inductor circuit as described in claim 1 wherein said second amplifying device also has an additional electrode for controlling its internal impedance, and wherein means are provided for applying a control effect to said additional electrode to vary the internal impedance of said second device to substantially only vary the Q of said simulated inductive reactance.

3. A simulated inductor circuit as described in claim 2 wherein said first and second amplifying devices each are dual-base tetrode-type transistors.

4. A simulated inductor circuit as described in claim 1 wherein said means for applying said control effect includes temperature-responsive means for counteracting variations in the internal impedance of said amplifying device caused by changes in ambient temperature.

5. In a receiver having a local oscillator, and a phase detector for developing a local reference signal of a predetermined frequency and phase from a received synchronizing signal, a frequency control circuit for said local oscillator comprising:
- means for simulating an inductance, including first and second cascade-connected solid-state amplifying devices each having an inherent internal impedance and each having a pair of primary electrodes, a control electrode and an additional electrode which varies said internal impedances according to a control signal applied thereto, the value of said simulated inductance being a function of said internal impedances of said amplifying devices;

tuned circuit means coupled to said local oscillator and including said simulated inductor means;

means for applying said local signal and said synchronizing signal to said phase detector for developing an error signal indicative of any phase difference therebetween;

and means for applying said error signal to one of said additional electrodes to alter the resonant frequency of said tuned circuit to minimize said phase difference.

6. A frequency control circuit as described in claim 5 wherein temperature compensating means are provided which modify the error signal applied to said first device and apply a control signal to said additional electrode of said second amplifying device to counteract changes in the internal impedance of said devices with changes in ambient temperature.

References Cited

UNITED STATES PATENTS

| | | | |
|---|---|---|---|
| 3,152,309 | 10/1964 | Bogusz et al. | 333—80 |
| 3,343,003 | 9/1967 | Arseneau | 333—80 X |

OTHER REFERENCES

Honeywell: "Power Tetrode Application Data," Minneapolis-Honeywell Regulator Company, Nov. 17, 1960, pp. 6, 7.

ROY LAKE, *Primary Examiner.*

S. H. GRIMM, *Assistant Examiner.*